US006881966B2

(12) United States Patent
Benveniste et al.

(10) Patent No.: US 6,881,966 B2
(45) Date of Patent: Apr. 19, 2005

(54) HYBRID MAGNETIC/ELECTROSTATIC DEFLECTOR FOR ION IMPLANTATION SYSTEMS

(75) Inventors: Victor M. Benveniste, Gloucester, MA (US); Robert D. Rathmell, Murphy, TX (US); Yongzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 121 days.

(21) Appl. No.: 10/461,702

(22) Filed: Jun. 13, 2003

(65) Prior Publication Data

US 2004/0227105 A1 Nov. 18, 2004

Related U.S. Application Data

(60) Provisional application No. 60/470,926, filed on May 15, 2003.

(51) Int. Cl.[7] .................. H01J 37/30; H01J 37/317; H01J 27/18
(52) U.S. Cl. ......... 250/492.21; 250/298; 250/396 ML; 250/396 R; 250/492.1; 250/492.2; 250/492.3
(58) Field of Search ................. 250/396 R, 396 ML, 250/298, 492.2, 492.21, 49, 492.1, 492.3

(56) References Cited

U.S. PATENT DOCUMENTS

| | | | | |
|---|---|---|---|---|
| 5,023,462 A | * | 6/1991 | Yamada et al. | 250/492.2 |
| 5,132,544 A | * | 7/1992 | Glavish | 250/492.2 |
| 5,206,516 A | * | 4/1993 | Keller et al. | 250/492.2 |
| 5,311,028 A | * | 5/1994 | Glavish | 250/492.21 |
| 5,393,984 A | * | 2/1995 | Glavish | 250/396 ML |
| 5,468,955 A | * | 11/1995 | Chen et al. | 250/251 |
| 5,719,403 A | * | 2/1998 | Purser | 250/492.21 |
| 5,780,863 A | | 7/1998 | Benveniste et al. | |
| 5,969,366 A | | 10/1999 | England et al. | |
| 6,160,262 A | * | 12/2000 | Aoki et al. | 250/492.21 |
| 6,326,631 B1 | | 12/2001 | Politiek et al. | |
| 6,441,382 B1 | | 8/2002 | Huang | |
| 6,489,622 B1 | | 12/2002 | Chen et al. | |
| 6,498,348 B1 | * | 12/2002 | Aitken | 250/396 ML |
| 6,521,895 B1 | | 2/2003 | Walther et al. | |
| 6,635,880 B1 | * | 10/2003 | Renau | 250/396 ML |
| 2002/0179854 A1 | | 12/2002 | Tsukihara et al. | |
| 2003/0066976 A1 | | 4/2003 | Chen et al. | |
| 2003/0173914 A1 | * | 9/2003 | Yamashita | 315/500 |

OTHER PUBLICATIONS

"Charged Particle Beams", Acceleration and Transport of Neutralized Ion Beams, Stanley Humphries, Jr., 1990, pp. 528–534.

* cited by examiner

Primary Examiner—John R. Lee
Assistant Examiner—Bernard E. Souw
(74) Attorney, Agent, or Firm—Eschweiler & Associates, LLC

(57) ABSTRACT

A magnetic deflector for an ion beam is disclosed and comprises first and second coils. The coils are positioned above and below the beam, respectively, and extend along a width of the beam. Current passes through the coils to generate a magnetic field therebetween that is generally perpendicular to a direction of travel of the beam along substantially the entire width thereof. In another aspect of the invention, a method of deflecting a beam prior to implantation into a workpiece is disclosed. The method includes determining one or more properties associated with the beam and selectively activating one of a magnetic deflection module and an electrostatic deflection module based on the determination.

34 Claims, 9 Drawing Sheets

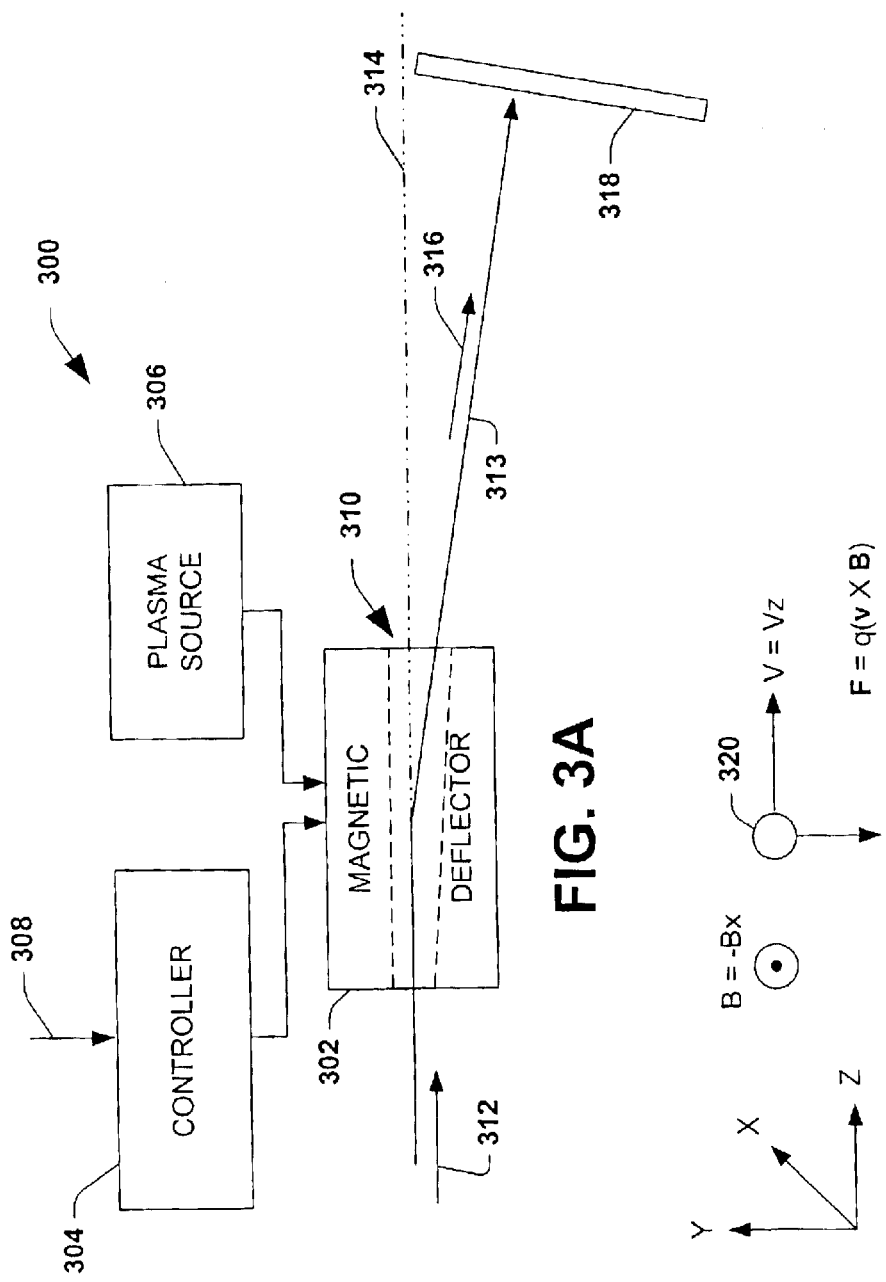

HYBRID MAGNETIC/ELECTROSTATIC DEFLECTOR FOR ION IMPLANTATION SYSTEMS

This application claims priority to U.S. Application No. 60/470,926 filed May 15, 2003, which is entitled "High Mass Resolution Magnet for Ribbon Beam Ion Implanters".

FIELD OF THE INVENTION

The present invention relates generally to ion implantation systems, and more particularly to a deflector system employed in an ion implantation system to decelerate an ion beam to low energies.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam. The ion beam is typically mass analyzed to select ions of a desired mass/charge ratio and then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

In order to achieve a desired implantation for a given application, the dose and energy of the implanted ions may be varied. The ion dose controls the concentration of implanted ions for a given semiconductor material. Typically, high current implanters are used for high dose implants, while medium current implanters are used for lower dose applications. The ion energy is used to control junction depth in semiconductor devices, where the energy levels of the beam ions determine the degree to which ions are implanted or the depth of the implanted ions within the semiconductor or other substrate material. The continuing trend toward smaller semiconductor devices requires a mechanism that serves to deliver high beam currents at low energies. The high beam current provides the necessary dose levels, while the low energy permits shallow implants.

Medium current implantation systems are typically single wafer systems and are capable of high tilt angle implants. Such systems are typically suitable for low and medium dose processes in the medium to high energy range (e.g., 10–250 keV). At low energies, the beam current capability often drops substantially due to poor beam transport efficiency through the various optical elements within the beamline. One technique commonly used to improve the beam transport efficiency is to transport the beam at a high energy, and then decelerate the beam to the desired energy at a short distance from the workpiece. Typically, the higher the deceleration ratio, the more gain in beam transport efficiency.

Deceleration systems such as the one described above, however, sometimes produce undesirable energy contamination at the workpiece. Energy contamination is a condition where neutral particles that are generated within the beam prior to deceleration are allowed to reach the target. Since the neutral particles are not decelerated, such particles reach the workpiece at a substantially higher energy than the rest of the ion beam, and thus are often referred to as energy contaminants.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a magnetic deflector in an ion implantation system. The magnetic deflector provides a substantially uniform magnetic field substantially transverse to a direction of beam travel. The magnetic field serves to exert a force on the moving ions within the ion beam (e.g., a pencil-shaped beam or a ribbon-shaped beam), thereby deflecting the beam away from the beam axis and such deflection serves to remove neutral particles from the beam that otherwise serve as energy contaminants.

In accordance with one aspect of the present invention, the magnetic deflector comprises a pair of coils positioned above and below the ion beam, respectively. The coils, upon conduction of current therethrough, operate to generate a magnetic field between the coils that is oriented substantially perpendicular to the direction of beam travel. The coils preferably extend laterally along the entire width of the beam when the beam is ribbon-shaped or scan to appear as a ribbon beam, thereby providing a uniform magnetic field along the entire beam width. In addition, plasma may be introduced into the region between the coils to facilitate in a neutralization of space charge, particularly at low beam energies. The plasma may diffuse along the magnetic field lines between the coils to provide for substantial uniform space charge neutralization along the width of the beam.

In accordance with another aspect of the present invention, a hybrid magnetic and electrostatic deflector system is employed within an implantation system. The hybrid deflector system comprises a magnetic deflector module and an electrostatic deflector module, along with a controller that is operable to selectively activate one of the modules based upon one or more input control signals. For example, the controller is operable to activate the magnetic deflector module when the input control signal(s) indicates that a mass-energy product is less than a predetermined threshold and activate the electrostatic deflector module when the mass-energy product is greater than the threshold. In the above manner, the hybrid system employs magnetic deflection at low beam energies, wherein plasma may be employed to mitigate the impact of space charge effects that may be problematic at low energies. Likewise, the hybrid system may employ electrostatic deflection at higher beam energies when space charge effects are less pronounced and where magnetic rigidity limits may be experienced.

In accordance with the present invention, the hybrid deflector is applicable to pencil beams, ribbon beams or scanned pencil beams that are ribbon-like in nature.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 3A is a block diagram illustrating a magnetic deflection system employed for reducing energy contamination in accordance with an aspect of the present invention;

FIG. 3B is a diagram illustrating the impact of a magnetic field on a moving ion in accordance with the Lorentz force equation;

DETAILED DESCRIPTION OF THE INVENTION

Figure 1:
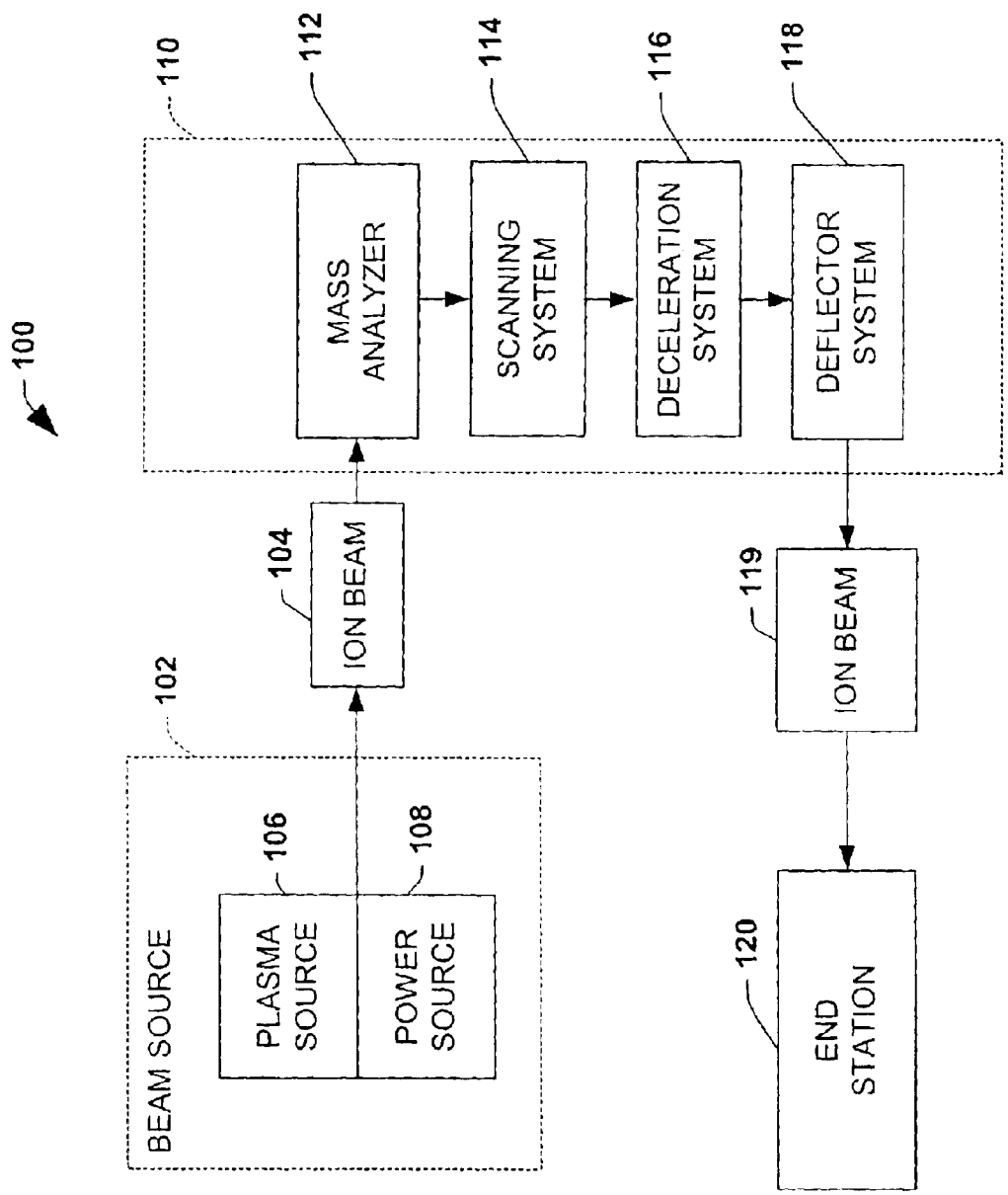
FIG. 1 is a schematic block diagram illustrating components of an ion implantation system in accordance with one or more aspects of the present invention.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

The present invention pertains to a deflection system employed in conjunction with a deceleration system to obtain a low energy ion beam. The deflection system is configured to receive an ion beam and deflect the beam from an incoming beamline axis toward the workpiece in order to prevent neutral particles from reaching the workpiece. As will be further appreciated below, the present invention includes a magnetic deflector that is operable to deflect the beam away from the beamline axis. The magnetic deflector may further be employed in conjunction with an electrostatic deflector to form a hybrid deflection system, wherein the magnetic deflector module is employed for deflection at generally low ion beam energies, while the electrostatic deflection module is employed at generally higher beam energies. The present invention is applicable to both pencil beam and ribbon beam implantation systems.

Referring initially to FIG. 1, an ion implantation system 100 suitable for implementing one or more aspects of the present invention is depicted in block diagram form. The system 100 includes an ion source 102 for producing an ion beam 104 along a beam path. As will be discussed in further detail below, the ion beam may comprise a pencil-type beam or a ribbon beam. The ion beam source 102 includes, for example, a plasma source 106 with an associated power source 108. The plasma source 106 may, for example, comprise a plasma confinement chamber from which an ion beam is extracted.

A beamline assembly 110 is provided downstream of the ion source 102 to receive the beam 104 therefrom. The beamline assembly 110 may include a mass analyzer 112, a scanner 114 (for a pencil-beam type system), a deceleration system 116, and a deflector system 118. The beamline assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The scanner 114 is operable to adjust a direction of the beamline axis in order to direct or "scan" the pencil beam across the workpiece in a controlled fashion so as to produce the effect of a ribbon shaped beam. The scanner may be electrostatic or magnetic and any such scanning mechanism or other type systems may be employed in conjunction with the present invention. As an alternative to scanning a pencil shaped beam to product a ribbon-like beam, one could use an ion source that directly produces a ribbon beam. One exemplary ribbon beam source that may be employed in conjunction with the present invention is disclosed in U.S. application Ser. No. 10/136,047, filed on May 1, 2002, and assigned to the assignee of the present invention, and is hereby incorporated by reference in its entirety.

The beamline 110 further comprises a deceleration module 116 that is controllable and selectively operable to alter an energy associated with the ion beam. For example, at medium energies no substantial change in beam energy may be necessary, and the module allows the beam to pass therethrough without a substantial change thereto. Alternatively, in low energies applications (e.g., for formation of shallow junctions in a semiconductor body), the energy of the beam may need to be decelerated. In such circumstances, the deceleration module 116 is operable to reduce the energy of the beam to a desired energy level by deceleration thereof.

The beamline further comprises a deflection system 118 according to the present invention. The deflection system 118 includes a magnetic deflector that is operable, after passing through the deceleration system 116, to deflect the ion beam away from the beamline axis. For example, if the incoming beam has been decelerated, any neutral particles entrained within the beam have not been decelerated, and thus such neutral particles will otherwise reach the workpiece as energy contaminants. The magnetic deflector of the deflection system 118 is operable under such circumstances to deflect the ion beam away from the beamline axis and towards the workpiece. The neutral particles, however, are not deflected by the magnetic deflector and thus continue traveling along what was previously the beamline axis, thus not reaching the workpiece.

It will be appreciated that the neutral contaminating particles may be produced in a region upstream of the deflection system by collisions among ions and background or residual particles. Such encounters can cause some of the ions to exchange charges with the background or other particles, thereby becoming neutral particles or contaminants. These neutral particles can be implanted into the wafer in areas that are to be doped with ions, thereby diluting the intended level of doping and adversely affecting the doping process. More importantly, because these particles are electrically neutral they can pass through the decelerator, and more particularly through electrostatic fields generated by the electrodes unaffected (e.g., without being decelerated, focused, bent or otherwise altered in speed and/or direction). As such, these particles can be implanted into the wafer at undesired depths as their (unaffected) energy levels will likely differ from the energy levels of the bent, focused, accelerated and/or decelerated ions in the ion beam that have passed through and been adjusted by the accelerator. This neutral particle contamination can severely degrade the desired performance of resulting semiconductor devices.

One or more aspects of the present invention address neutral particle contamination, at least, by bending the ion beam to deflect the ions away from the neutral contaminants within the beam. The decontaminated beam of ions may, for example, be deflected by an angle of between about 5 to 25 degrees from the path of the contaminants, which also happens to be the original beam path of the beam since the contaminants, being electrically neutral, are unaffected by the electrodes. The ion beam is directed to the workpiece to encounter select areas of the workpiece for implantation thereof. It will be appreciated that some type of barrier can, for example, be placed in front of the stream of neutral particles to prevent the contaminants from encountering the workpiece or wafer.

It will be further appreciated that one or more aspects of the present invention also address issues related to ion beam blow up. Beam blow up occurs as a result of the repulsive properties of like charged particles. Positively charged ions which form the ion beam repulse each other because of a so-called "space-charge force". Space-charge effects are inversely proportional to the 3/2 root of the ion beam energy, and thus may increase as the ions in the beam are decelerated, making the beam more prone to dispersal or blow up. Because of the space-charge force, the lateral spread of an ion beam is proportional to:

$$(\sqrt{m}\, 1\sqrt{q}) \times (IZ^2/U^{3/2})$$

where m is an ion mass, q is an ion charge, I is a beam current, U is beam energy, and z is the traveling distance of the ion beam, assuming that the ion beam is uniform. Thus, it can be appreciated that the likelihood of beam blow up increases as the beam energy decreases. Accordingly, if an ion beam has a lower energy, it becomes more difficult for all ions to reach the wafer, particularly where the beam is decelerated and there is a large beam current or concentration of ions within the beam.

The magnetic deflector of the present invention provides advantages over electrostatic deflection mechanisms at low energies. At low energies, problems associated with space charge forces may become exacerbated, resulting in a tendency for beam blow-up, which is undesirable. With deflection occurring in the presence of a magnetic field, plasma may be employed therein to help neutralize the space charge. The magnetic field generally provides a resistance of plasma diffusion across field lines, but exhibits little resistance for plasma diffusion along the field lines. Since the magnetic field, as will be appreciated in greater detail below, is oriented generally perpendicular to the direction of travel (or propagation) of the beam, the plasma may readily diffuse transversely across the entire width of the beam (either the ribbon beam or scanned pencil beam that appears ribbon-like near the workpiece), thereby facilitating a uniform neutralization of space charge associated therewith.

Returning to FIG. 1, an end station 120 is also provided in the system 100 to receive the mass analyzed, substantially decontaminated ion beam 119 from the beamline assembly 110. The end station 120 supports one or more workpieces such as semiconductor wafers (not shown) along the beam path (however, offset from the original beamline axis due to the deflector 118) for implantation using the ion beam 119.

Figure 2:
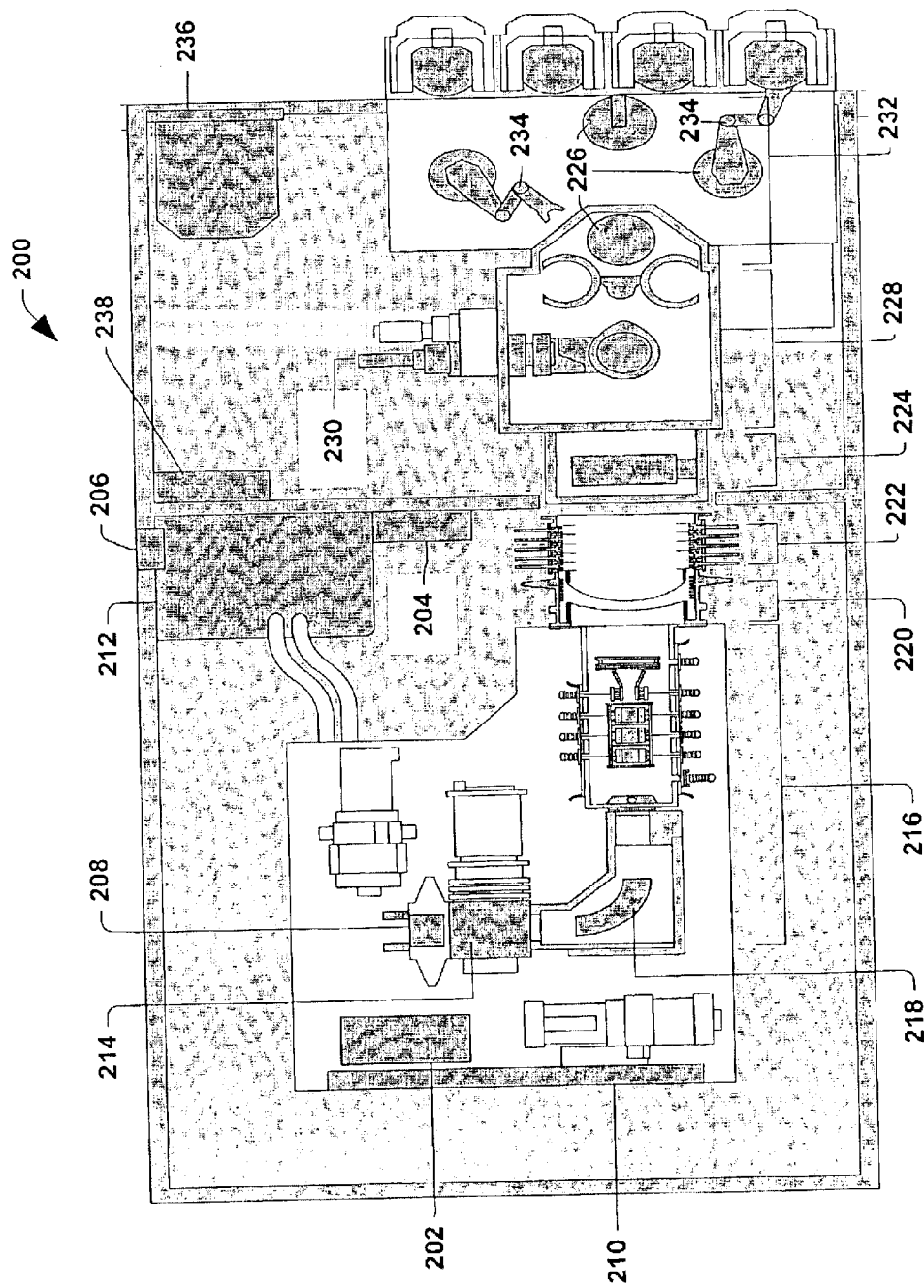
FIG. 2 is a schematic view of an ion implantation system in accordance with one or more aspects of the present invention.

FIG. 2 illustrates in greater detail an exemplary ion implantation system 200 suitable for providing a medium current pencil beam or ribbon beam at low energies according to one or more aspects of the present invention. The system 200 includes, for example, a modular gas box 202, an auxiliary gas box 204 and a gas box remote purge control panel 206. The gas boxes 202, 204 comprise, among other things, one or more gases of a dopant substance, and facilitate a selective delivery of the gas(es) into an extended life ion source 208 within the system 200, wherein the gas(es) can be ionized to generate ions suitable for implantation into wafers or workpieces selectively brought into the system. The gas box remote control panel 206 facilitates venting or purging gas(es) or other substances out of the system 200 on an as needed or desired basis.

High voltage terminal power distribution 210 and a high voltage isolation transformer 212 are included to, among other things, electrically excite and impart energy to the dopant gas(es) to generate ions from the gas(es). An ion beam extraction assembly 214 is included to extract ions from the ion source 208 and accelerate them into a beamline 216, which includes a mass analysis magnet 218. The mass analysis magnet 218 is operable to sort out or reject ions of an inappropriate charge-to-mass ratio. In particular, the mass analysis magnet 218 comprises a beamguide having curved sidewalls into which ions of an undesired mass-to-charge ratio collide as they are propagated through the beamguide by way of one or more magnetic fields.

A component 220 may be included to assist with controlling the angle of the scanned ion beam. This may include, among other things, a scan angle correction lens. An acceleration/deceleration column 222 facilitates controlling and adjusting the speed, and/or focusing, of ions within the ion beam. A deflection system 224 is further included and, as discussed briefly above, is operable to filter out contaminant particles to mitigate energy contaminating particles from encountering wafers or workpieces.

Wafers or workpieces 226 are loaded into an end station chamber 228 for selective implantation with ions. A mechanical scan drive 230 maneuvers the wafers within the chamber 228 to facilitate selective encounters with the beam(s). The wafers or workpieces 226 are moved into the end station chamber 228 by a wafer handling system 232, which may include, for example, one or more mechanical or robotic arms 234. An operator console 236 allows an operator to regulate the implantation process by selectively controlling one or more components of the system 200. Finally, a power distribution box 238 is included to provide power to the overall system 200.

Turning now to FIG. 3A, an exemplary deflector system, such as systems 118, 224 of FIGS. 1 and 2, is illustrated and designated at reference numeral 300 according to one aspect of the present invention. The deflector system 300 comprises a magnetic deflector 302 coupled to a controller 304 and operationally associated with a plasma source 306. The magnetic deflector 302 is activated by the controller 304 based on one or more input control signals 308 and is operable to generate a magnetic field in a region 310 that is generally perpendicular (or transverse) to a direction of travel 312 of the ion beam 313. In accordance with the present example, the beam is a pencil beam, a scanned pencil beam (thus appearing ribbon-like due to its scanning) or a ribbon beam, and all such alternatives are contemplated by the present invention. More particularly, the magnetic field 310 is operable to deflect the ion beam away from a beamline axis 314 in a direction 316 toward a workpiece 318 such as a semiconductor wafer.

The magnetic deflector 302 is operable to generate a magnetic field that is substantially uniform across the beam, and in the case of a ribbon or ribbon-like beam, an entire width (not shown) of the beam 313. Consequently, the deflection of the beam 313 along the direction 316 occurs substantially uniformly across the entire beam width to advantageously maintain uniformity of the ribbon beam. In addition, the plasma source 306 provides plasma to the region 310 to facilitate a neutralization of space charge associated with the beam that may be significant at low beam energies. Use of a magnetic field for deflection at low beam energies is beneficial since the magnetic field does not extinguish or push away the plasma. Rather, the plasma is generally permitted to diffuse through the region 310 along the magnetic field lines.

The magnetic field serves to deflect ions in the beam 313 in accordance with the Lorentz force equation: $F=q(v \times B)$, wherein a charge moving with a velocity in a direction indicated by the velocity vector v in the presence of a magnetic field oriented as indicated by the magnetic field vector B is a value having a direction indicated by the force vector F. More particularly, as illustrated in FIG. 3B, if an ion 320 in the beam is positively charged and moving with velocity V in the Z direction, and a magnetic field is oriented in the X direction perpendicular to the direction of travel, a force is exerted on the ion in the negative Y direction, or in this example, downwards as illustrated.

The plasma source 306 is operationally associated with the magnetic field region 310. In one example, the plasma is beam plasma caused by interaction of ions within the beam with any residual gas that may exist within the region. Alternatively, the plasma source may be a source of gas that has high ionization efficiency such as Xenon, for example. In yet another alternative, the plasma source 306 may be a plasma flood or other type device operable to generate and inject plasma into the magnetic field region.

Since the magnetic field within the region serves to deflect ions in the beam, it is desirable for the magnetic field to be as uniform as possible across the beam, and particularly across the entire width of the beam when employing a ribbon or ribbon-like beam. In one exemplary application where the ribbon beam is scanned across a 300 mm semiconductor wafer, the ribbon beam is greater than 300 mm wide, and thus it is desirable that the magnetic field be uniform over a distance corresponding to the ribbon width that is substantially greater than the ribbon width to minimize distortion at edges of the ribbon beam.

Figure 4B:
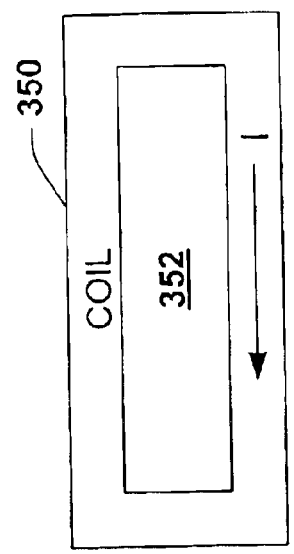
FIG. 4B is a cross section of FIG. 4A taken along lines 4B–4B illustrating the magnetic deflector portion and current flow through the coil.
Figure 4A:
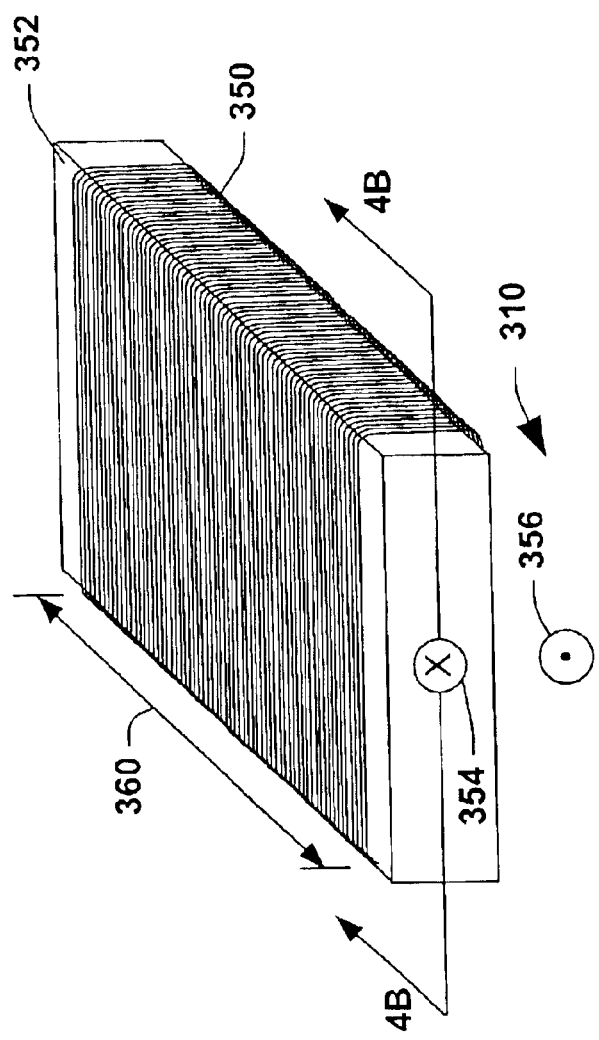
FIG. 4A is a perspective view of a portion of an exemplary magnetic deflector comprising a coil in accordance with an exemplary aspect of the present invention.

In accordance with one exemplary aspect of the present invention, the magnetic field of the magnetic deflector 302 is generated using a pair of coils, one of which is illustrated in FIG. 4A and designated at reference numeral 350. The coil 350 comprises, in one example, a conductor wrapped around a yoke 352. When current conducts through the coil 350, a magnetic field is generated through the loop with the magnetic field lines forming a closed path. As illustrated in FIG. 4B, if a current (I) through the coil 350 is in the clockwise direction (electrons moving in counterclockwise direction), then according to the right hand rule, the resultant magnetic field comes into the page at 354 in the yoke and out of the page at 356 in the magnetic field region 310 wherein the ribbon beam travels, as illustrated in FIG. 4A. By having a distance or lateral extent 360 at which the coil 350 extends along the yoke 352 be larger than the width of the ribbon beam, a substantially uniform magnetic field exists along the entire beam width. Alternatively, other magnetic field generation mechanisms may be employed such as, for example, permanent magnets or electromagnets to generate a dipole field.

Figure 5A:
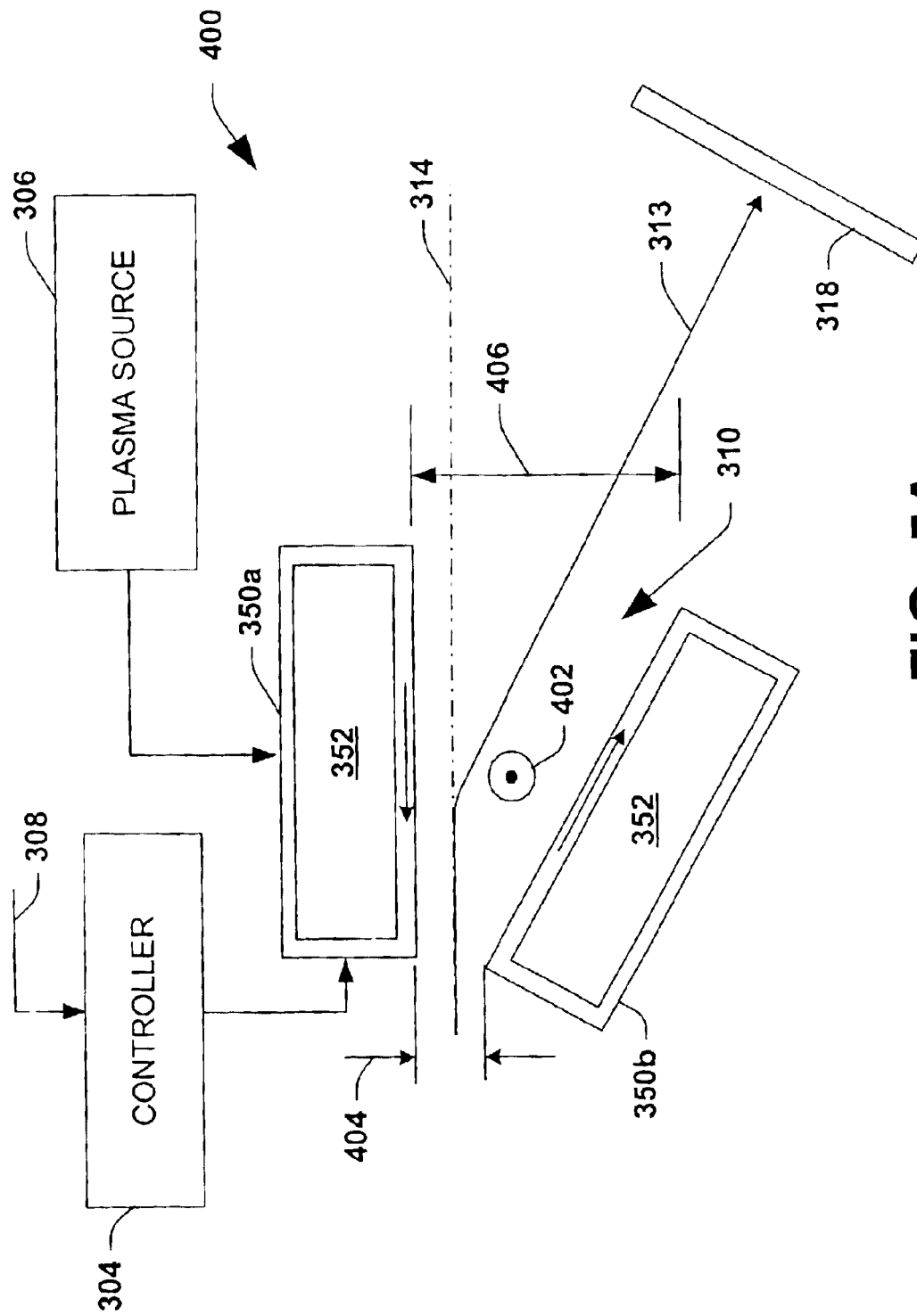
FIG. 5A is a block diagram illustrating a magnetic deflection system employing a pair of coils to generate a magnetic field oriented generally perpendicular to a direction of travel of a ribbon beam according to an aspect of the present invention.

FIG. 5A illustrates a system 400 having a magnetic deflector employing a pair of coils 350, wherein the first coil 350*a* resides above the beam 313 and the second coil 350*b* is positioned below the beam, respectively. The coils 350 operate in conjunction with one another to form a magnetic field 402 in the field region 310 that is substantially perpendicular to the direction of travel of the beam. In addition, the first and second coils 350 in the present example are configured such that an input end has an opening size 404 and an output end located downstream from the input end having an opening size 406 that is larger than the input. The larger output opening provides for the deflection of the beam without the beam being physically disrupted along the deflected path toward the workpiece 318. It should be understood, however, that coils configured substantially parallel to one another may also be employed and are contemplated as falling within the scope of the present invention.

Having the pair of coils 350*a*, 350*b* aids in providing uniformity of the magnetic field 402 in both the width direction and the height direction of the ribbon or ribbon-like beam. Each coil 350 has a current flowing in the same direction so that the resulting magnetic fields that superimpose on one another are additive as opposed to canceling out one another. By varying a current in one or both of the coils, the strength of the magnetic field 402 within the magnetic field region 310 may be tuned to adjust an amount of deflection of the beam or to provide for a given deflection for a variety of differing dopant species or beam energies, as may be desired.

Figure 5B:
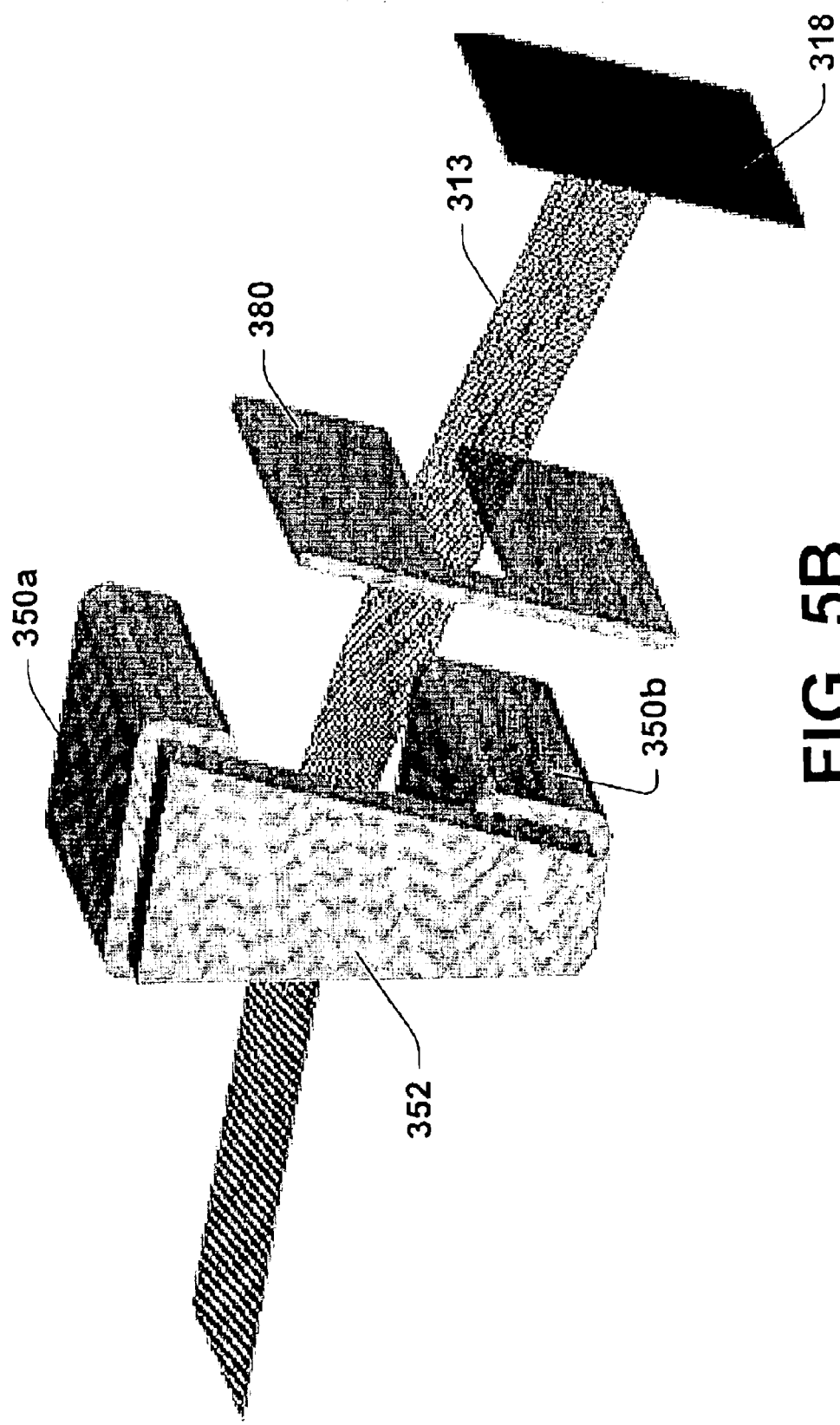
FIG. 5B is a perspective view of an exemplary magnetic deflector in accordance with the present invention.

FIG. 5B is a perspective view of a magnetic deflector in accordance with one exemplary aspect of the present invention. Note that in FIG. 5B, the pair of coils 350*a*, 350*b* are positionally coupled together via a single yoke 352. In addition, a guard plate 380 is placed after the deflector to catch or collect neutral particles still traveling along what was previously the beamline axis, since such particles are not deflected. Further, multi-cusp magnets may be employed on side portions of the yoke disposed between the coils to aid in beam confinement at the edges of the ribbon or ribbon-like beam.

Figure 6A:
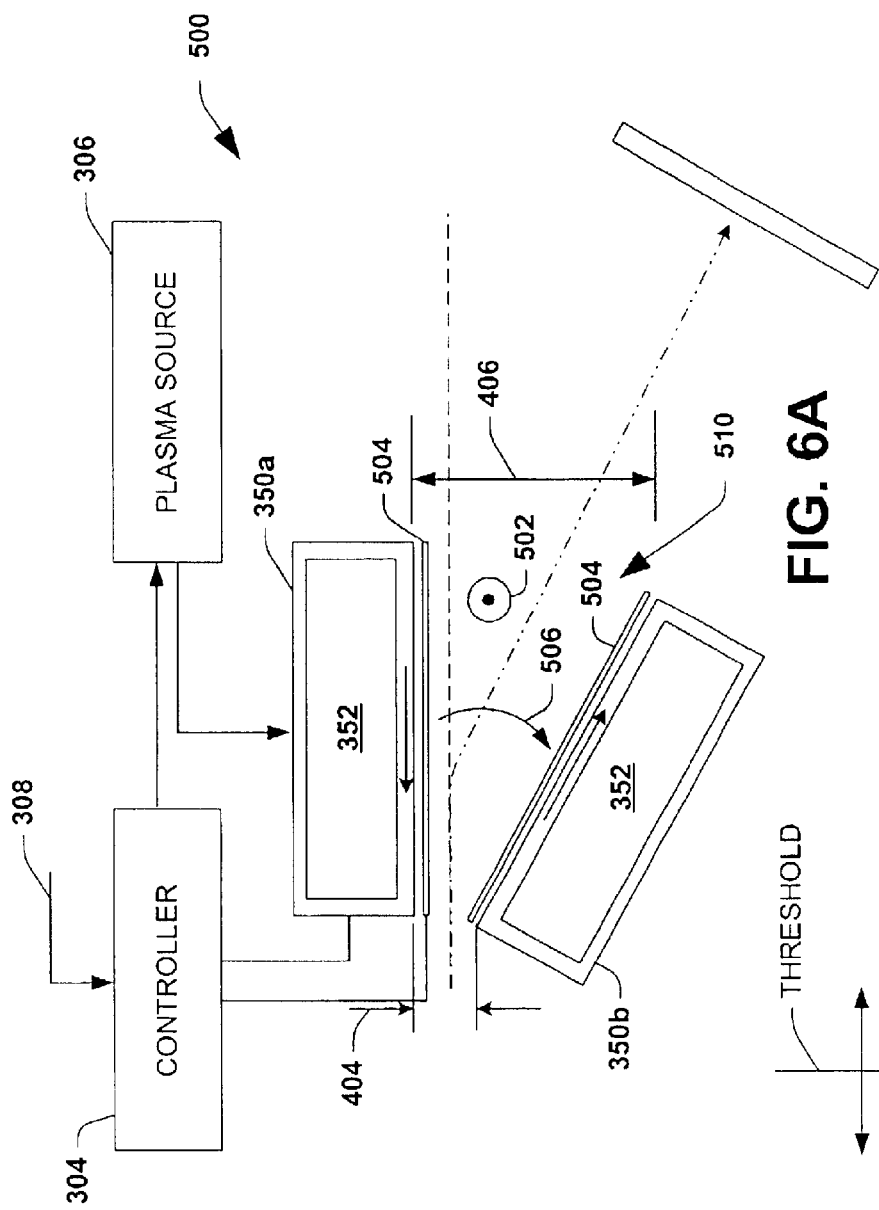
FIG. 6A is a block diagram illustrating a hybrid magnetic/electrostatic deflection system for deflecting an ion beam to reduce energy contamination in accordance with another aspect of the present invention.

In accordance with another aspect of the present invention, FIG. 6A illustrates a hybrid magnetic/electrostatic deflection system, and is designated at reference numeral 500. The hybrid deflection system 500 comprises a magnetic deflector module and an electrostatic deflector module, respectively. The magnetic deflector module is illustrated in FIG. 6A as a pair of coils 350 above and below the beam 313, respectively. The electrostatic deflector module is illustrated in the present example as a pair of electrodes 504 or laterally extending conductive plates positioned above and below the beam, respectively. Both the magnetic deflector module and the electrostatic deflector module are operably coupled to the controller 304 that is operable to selectively activate one of the modules based on one or more input signals 308.

Figure 6B:
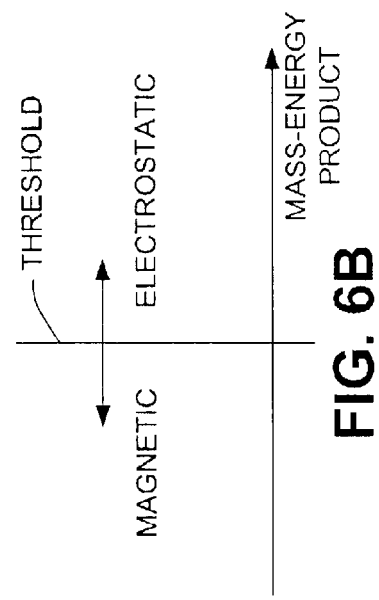
FIG. 6B is a graph illustrating a threshold associated with a mass-energy product and a selection of magnetic or electrostatic deflection based on the mass-energy product.

In accordance with one exemplary aspect of the present invention, the controller 304 is operable to selectively activate one of the modules based on a mass-energy product associated with the beam. For example, as illustrated in FIG. 6B, for a mass-energy product less than a predetermined threshold, the controller 304 activates the magnetic deflector module, and in some cases the plasma source 306, such that the beam is deflected via a magnetic field 502 within a deflection region 510. Likewise, when the controller 304 determines, based on the one or more input control signals 308, that a mass-energy product is greater than the threshold, the controller selectively activates the electrostatic deflector module to effectuate deflection of the ion beam using an electrostatic field 506 within the field region 510.

The hybrid deflector 500 of the present invention employs the magnetic deflector at low energies where space charge effects are substantial. Use of the magnetic deflector permits use of plasma in the field region 510 to facilitate space charge neutralization. The plasma within the field region 510 tends to experience resistance across magnetic field lines and thus does not tend to cross such field lines, however, the plasma resistance is substantially reduced along the field lines. Consequently, the plasma within the field region 510 will tend to diffuse (in the case of a ribbon or ribbon-like beam) in the width direction of the beam along the field lines, thereby enabling a substantially uniform plasma therein, which facilitates uniformity in the space charge neutralization.

At higher beam energies significant beam current can be transported through the electrostatic deflector module despite the absence of plasma due to reduced space charge effects at higher energies. Therefore for mass-energy products greater than a predetermined threshold (e.g., 4000 keV-amu's), the controller selectively activates the electrostatic deflector module, thereby biasing the electrodes 504 and causing an electrostatic field 506 to form in the field region 510. An ion within an electrostatic field experiences a force thereon in accordance with the equation: $F=qE$, wherein the force is exerted on the charge in the direction of the electrostatic field. Preferably, the electrodes 504 extend laterally along at least an entire width of the ribbon or ribbon-like beam in such beam configurations such that the electrostatic field exerted on the beam is substantially uniform along the entire beam width, thereby reducing distortion along the beam edges. The electrostatic deflection is advantageous at higher beam energies since magnetic deflection may have some limitations thereat due to magnetic rigidity.

Figure 7B:
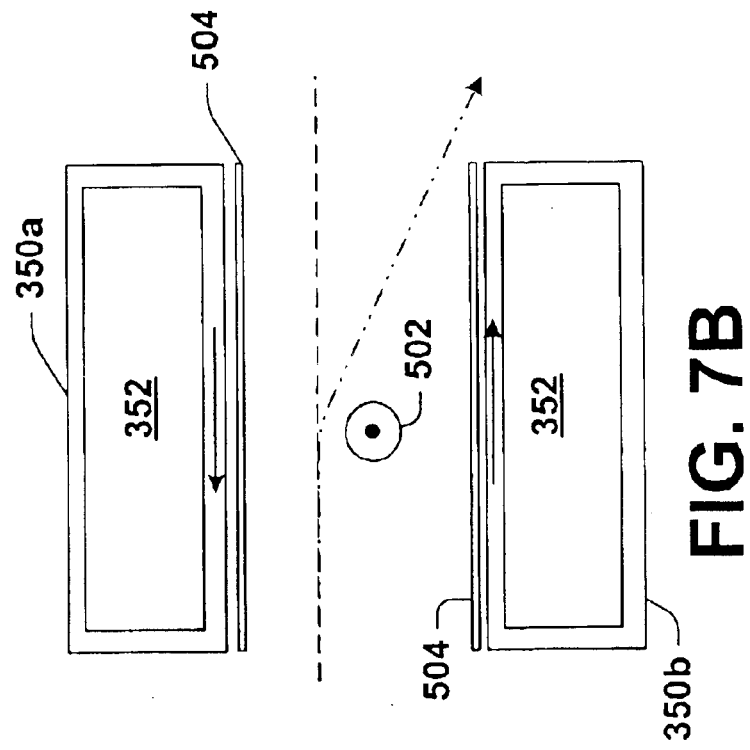
FIGS. 7A and &B are block diagrams illustrating the hybrid magnetic/electrostatic deflection system according to additional examples.
Figure 7A:
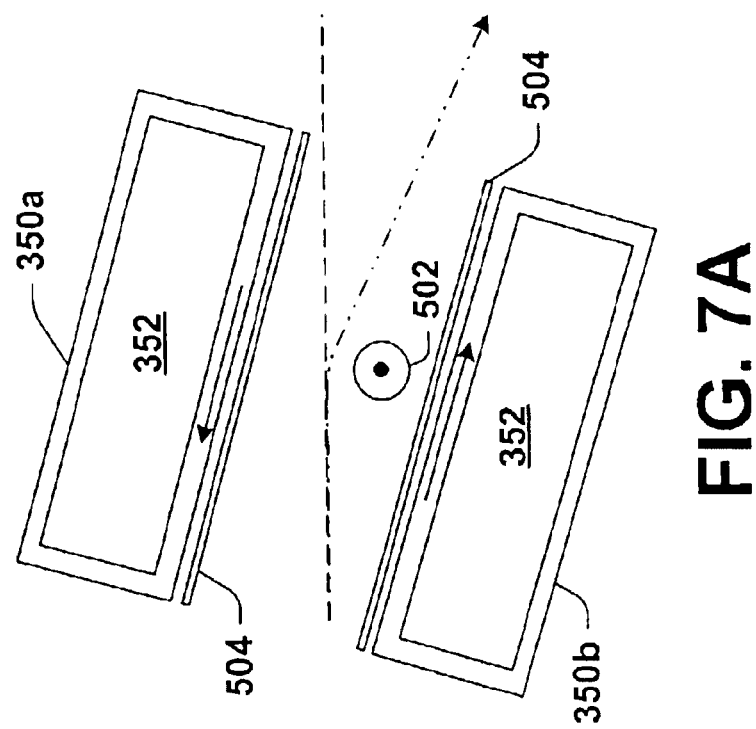

According to an alternative aspect of the invention, as illustrated in FIGS. 7A and 7B, respectively, the coils 350a, 350b may be oriented in a variety of fashions. As illustrated in FIG. 7A, the coils may be parallel to one another as well as to the beamline axis. Alternatively, as illustrated in FIG. 7B, the coils 350a, 350b may be parallel to one another as well as to the post-deflection axis. In either event, the opening 404 into the system is approximately the same size as the exit opening 406. These and other alternative arrangements of the coils may be employed and are contemplated as falling within the scope of the present invention.

Figure 8:
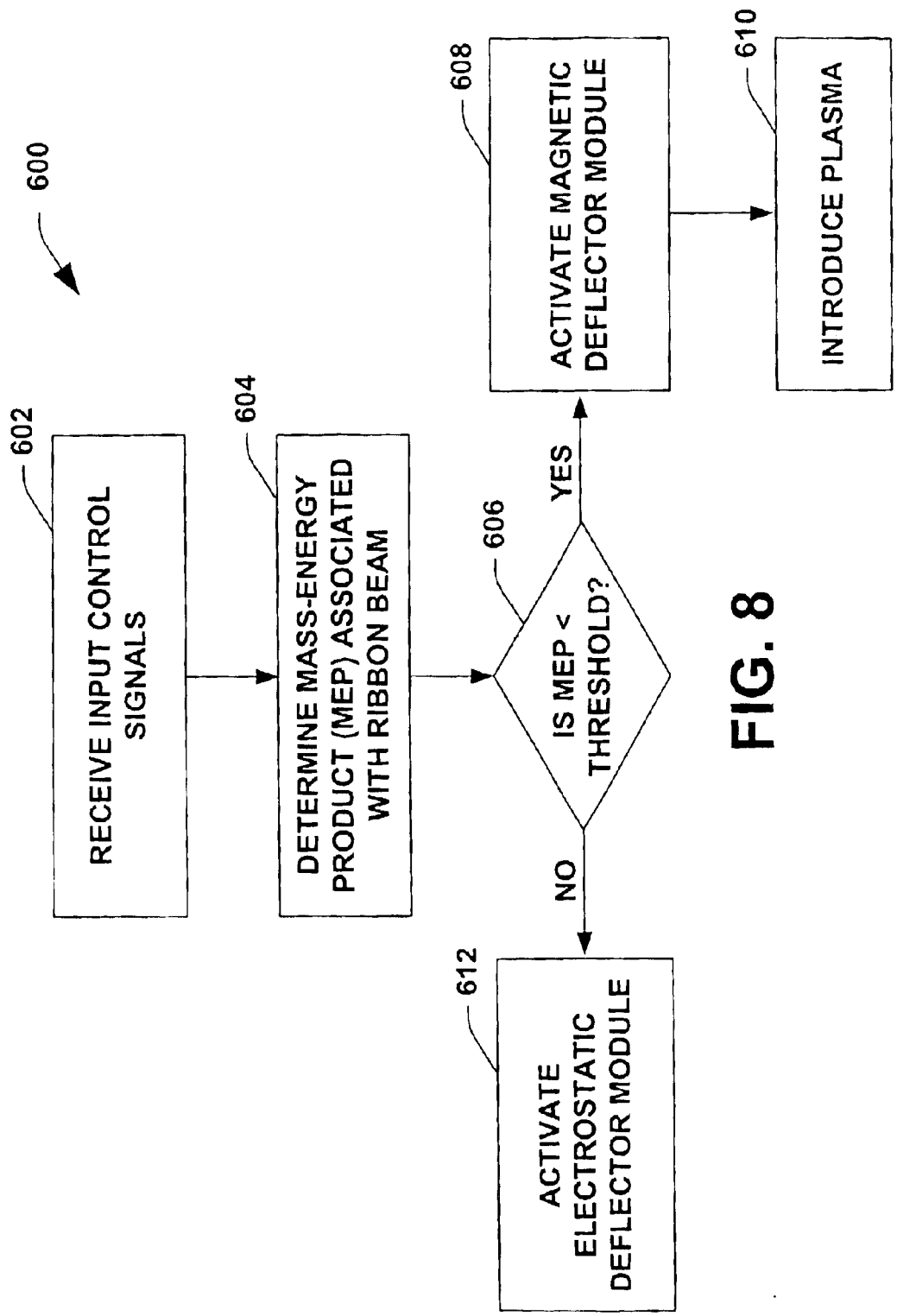
FIG. 8 is a flow chart diagram illustrating a method of reducing energy contamination in ion implantation employing a pencil beam or a ribbon beam in accordance with yet another aspect of the present invention.

In accordance with yet another aspect of the present invention, a method of deflecting an ion beam toward a workpiece is provided, as illustrated in FIG. 8 and designated at reference numeral 600. Although the methodology 600 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 600 begins at 602, wherein one or more input control signals are received, for example, by a controller. The control signals may reflect, for example, the dopant species being employed, and the desired energy of the beam (e.g., a ribbon beam), which will be used to determine whether or how much post analysis deceleration should be employed prior to introduction to the deflection system. With information regarding the dopant species and the final energy level, the mass-energy product (MEP) may be determined at 604 and used to determine whether the mass-energy product is greater than a predetermined threshold at 606. Based on the determination, one of two different modules is activated. If the MEP is less than the threshold at 606 (YES), a magnetic deflector module such as one highlighted above is activated at 608 and plasma may be introduced or is otherwise formed at 610 to facilitate space charge neutralization.

Alternatively, if the MEP is determined to be greater than the predetermined threshold at 606 (NO), then an electrostatic deflector module is activated at 612. Use of different type of deflectors based on criteria such as a mass-energy product or beam energy advantageously allows the deflection mechanism to be customized for low energies. Consequently, higher beam currents may be effectively employed at low energies due to the neutralization of space charge.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention may include a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. In accordance with the present invention, the term "ribbon-like" should be understood to include both a ribbon beam and a scanned pencil type beam. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A magnetic deflector for a ribbon-shaped beam or a scanned pencil-shaped beam, comprising a pair of coils comprising a first coil and a second coil, wherein the first and second coils each comprise an iron yoke extending in a width direction along the entire width of the beam, and a conductor wrapped around the iron yoke and extending along the width direction along the entire width of the beam, wherein the first coil is positioned above the beam and the second coil is positioned below the beam, respectively, and wherein current passes through the first and second coils in the same direction, thereby inducing a magnetic field between the coils that is generally perpendicular to a direction of travel of the beam along substantially the entire width of the beam, wherein the first and second coils are positioned to form an input end and an output end, wherein the output end is downstream of the input end, and wherein the output end is larger than the input end.

2. The magnetic deflector of claim 1, wherein a magnitude of the current through the first and second coils is variable, thereby facilitating a variation in a strength of the magnetic field between the coils.

3. The magnetic deflector of claim 1, further comprising a plasma source associated with the pair of coils and operable to supply a plasma between the coils, thereby facilitating a neutralization of space charge associated with the beam.

4. The magnetic deflector of claim 3, wherein the plasma source comprises beam plasma associated with ions within the beam striking residual gas between the coils and causing an ionization of the residual gas.

5. The magnetic deflector of claim 3, wherein the plasma source is located along a side portion of the pair of coils, and wherein the plasma generated by the plasma source diffuses across the entire width of the beam along magnetic field lines associated with the magnetic field between the coils, thereby providing for space charge neutralization along the entire width of the beam.

6. The magnetic deflector of claim 1, further comprising a pair of electrodes, the electrode pair comprising a first electrode disposed between the first coil and the beam and a second electrode disposed between the second coil and the beam, wherein the electrode pair is operable to generate an electrostatic field therebetween for deflection of the beam passing therethrough.

7. The magnetic deflector of claim 6, further comprising a controller operably coupled to the pair of coils and the pair of electrodes, respectively, wherein the controller is operable to activate the pair of coils at a mass-energy product less than a predetermined threshold, and activate the pair of electrodes at a mass-energy product greater than the predetermined threshold.

8. A hybrid deflector system for ion implantation, comprising:
a magnetic deflection module operable to deflect an ion beam away from a beam axis;
an electrostatic deflection module operable to deflect the ion beam away from the beam axis; and
a controller operable to selectively activate one of the magnetic deflection module and the electrostatic deflection module based on mass-energy product associated with the ion beam.

9. The hybrid deflector system of claim 8, wherein the controller is operable to activate the magnetic deflection module when the one or more control signals indicate a mass-energy product less than a predetermined threshold.

10. The hybrid deflector system of claim 8, wherein the controller is operable to activate the electrostatic deflection module when the one or more control signals indicate a mass-energy product greater than a predetermined threshold.

11. The hybrid deflector system of claim 8, wherein the ion beam comprises a ribbon-shaped beam or a scanned pencil-shaped beam.

12. The hybrid deflector system of claim 11, wherein the magnetic deflection module comprises a first coil located above the beam and a second coil located below the beam, respectively, and wherein current conductive through the first and second coils induces a magnetic field oriented substantially transverse to a direction of travel of the beam.

13. A hybrid deflector system for ion implantation, comprising:
a magnetic deflection module operable to deflect an ion beam away from a beam axis, wherein the ion beam comprises a ribbon-shaped beam or a scanned pencil-shaped beam, wherein the magnetic deflection module comprises a first coil located above the beam and a second coil located below the beam, respectively, and wherein current conducting through the first and second coils induces a magnetic field oriented substantially transverse to a direction of travel of the beam;
an electrostatic deflection module operable to deflect the ion beam away from the beam axis; and
a controller operable to selectively activate one of the magnetic deflection module and the electrostatic deflection module based on one or more input control signals,
wherein the first coil and second coil are oriented to have an input end and an output end downstream of the input end, wherein an opening of the output end is larger than an opening of the input end.

14. The hybrid deflector system of claim 12, wherein the first and second coils extend along an entire width of the ion beam.

15. The hybrid deflector system of claim 14, further comprising a plasma source associated with the first and second coils and operable to supply a plasma between the coils, thereby facilitating a neutralization of space charge associated with the ion beam.

16. The magnetic deflector of claim 15, wherein the plasma source comprises beam plasma associated with ions within the beam striking residual gas between the coils and causing an ionization of the residual gas.

17. The magnetic deflector of claim 15, wherein the plasma source is located along a side portion of the first and second coils, and wherein the plasma generated by the plasma source diffuses across the entire width of the beam along magnetic field lines associated with the magnetic field between the coils, thereby providing for space charge neutralization along the entire width of the ion beam.

18. The hybrid deflector system of claim 8, wherein the electrostatic deflector module comprises a first electrode located above the ion beam and a second electrode located below the ion beam, respectively, wherein upon application of a voltage across the first and second electrodes, an electrostatic field is generated thereacross in a direction substantially transverse to a direction of travel of the ion beam.

19. An ion implantation system, comprising:
an ion source operable to generate an ion beam, wherein the ion beam comprises a ribbon-shaped beam or a scanned pencil-shaped beam;

a mass analyzer operable to receive the ion beam and remove ions having an undesired mass-to-charge ratio; and a magnetic deflector operable to receive the ion beam from the mass analyzer along a beam axis and deflect the ion beam away from the beam axis employing a magnetic field, wherein the magnetic deflector comprises a first coil and a second coil, wherein the first coil is positioned above the ion beam and the second coil is positioned below the ion beam, respectively, and wherein both the first and second coils extend along a width of the ion beam, and further wherein current passes through the first and second coils in the same direction, thereby inducing a magnetic field between the coils that is generally perpendicular to a direction of travel of the beam along substantially the entire width of the beam, wherein the first and second coils are positioned to form an input end and an output end, wherein the output end is downstream of the input end, and wherein the output end is larger than the input end.

20. The magnetic deflector of claim 19, wherein the first and second coils each comprise an iron yoke extending in a width direction along the entire width of the beam, and a conductor wrapped round the iron yoke and extending along the width direction along the entire width of the beam.

21. The magnetic deflector of claim 19, wherein a magnitude of the current through the first and second coils is variable, thereby facilitating a variation in a strength of the magnetic field between the coils.

22. The magnetic deflector of claim 19, further comprising a plasma source associated with the first and second coils and operable to supply a plasma therebetween, thereby facilitating a neutralization of space charge associated with the ion beam.

23. The magnetic deflector of claim 22, wherein the plasma source comprises beam plasma associated with ions within the ion beam striking residual gas between the first and second coils and causing an ionization of the residual gas.

24. The magnetic deflector of claim 22, wherein the plasma source is located along a side portion of the first and second coils, and wherein the plasma generated by the plasma source diffuses across the entire width of the ion beam along magnetic field lines associated with the magnetic field between the coils, thereby providing for space charge neutralization along the entire width of the beam.

25. The magnetic deflector of claim 19, further comprising a pair of electrodes, the electrode pair comprising a first electrode disposed between the first coil and the beam and a second electrode disposed between the second coil and the beam, wherein the electrode pair is operable to generate an electrostatic field therebetween for deflection of the ribbon-like beam passing therethrough.

26. An ion implantation system, comprising:

an ion source operable to generate an ion beam, wherein the ion beam comprises a ribbon-shaped beam or a scanned pencil-shaped beam;

a mass analyzer operable to receive the ion beam and remove ions having an undesired mass-to-charge ratio;

a magnetic deflector operable to receive the ion beam from the mass analyzer along a beam axis and deflect the ion beam away from the beam axis employing a magnetic field;

a pair of electrodes, the electrode pair comprising a first electrode disposed between the first coil and the beam and a second electrode disposed between the second coil and the beam, wherein the electrode pair is operable to generate an electrostatic field therebetween for deflection of the ribbon-like beam passing therethrough, and further comprising a controller operably coupled to the first and second coils and the first and second electrodes, respectively, wherein the controller is operable to activate the first and second coils at a mass-energy product less than a predetermined threshold, and activate the first and second electrodes at a mass-energy product greater than the predetermined threshold.

27. A method of deflecting an ion beam prior to implantation into a workpiece in order to reduce energy contamination, comprising:

determining one or more properties associated with the beam; and selectively activating one of a magnetic deflection module and an electrostatic deflection module based on the determination.

28. The method of claim 27, wherein determining one or more properties associated with the beam comprises determining an energy of the beam.

29. The method of claim 28, wherein selectively activating one of a magnetic deflection module and an electrostatic deflection module based on the determination comprises activating the magnetic deflection module if the energy of the ion beam is less than a predetermined threshold.

30. The method of claim 28, wherein selectively activating one of a magnetic deflection module and an electrostatic deflection module based on the determination comprises activating the electrostatic deflection module if the energy of the ion beam is greater than a predetermined threshold.

31. The method of claim 27, wherein determining one or more properties associated with the beam comprises determining a mass-energy product associated with the beam.

32. The method of claim 31, wherein determining one or more properties associated with the beam comprises determining whether the mass-energy product is less than a predetermined threshold.

33. The method of claim 32, wherein selectively activating one of a magnetic deflection module and an electrostatic deflection module based on the determination comprises activating the magnetic deflection module if the mass-energy product of the ion beam is less than the predetermined threshold.

34. The method of claim 32, wherein selectively activating one of a magnetic deflection module and an electrostatic deflection module based on the determination comprises activating the electrostatic deflection module if the mass-energy product of the ion beam is greater than the predetermined threshold.

* * * * *

UNITED STATES PATENT AND TRADEMARK OFFICE
CERTIFICATE OF CORRECTION

PATENT NO. : 6,881,966 B2
DATED : April 19, 2005
INVENTOR(S) : Victor M. Benveniste, Robert D. Rathmell and Yongzhang Huang It is certified that error appears in the above-identified patent and that said Letters Patent is hereby corrected as shown below:

<u>Column 5,</u>
Line 40, please replace the number "312" with the number -- 3/2 --.
Line 46, please replace the formula "$(\sqrt{m}\ 1\sqrt{q})x(IZ^2/U^{3/2})$" with the formula
-- $(\sqrt{m}/\sqrt{q})x(IZ^2/U^{3/2})$ --.

Signed and Sealed this

Thirtieth Day of August, 2005

JON W. DUDAS
*Director of the United States Patent and Trademark Office*